(12) United States Patent
Alhorn et al.

(10) Patent No.: US 9,825,641 B1
(45) Date of Patent: Nov. 21, 2017

(54) RECONFIGURABLE SENSOR MONITORING SYSTEM

(71) Applicant: The United States of America as Represented by the Administrator of the National Aeronautics and Space Administration, Washington, DC (US)

(72) Inventors: Dean C. Alhorn, Huntsville, AL (US); Kenneth R. Dutton, Athens, AL (US); David E. Howard, Hazel Green, AL (US); Dennis A. Smith, Athens, AL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 522 days.

(21) Appl. No.: 14/485,193

(22) Filed: Sep. 12, 2014

(51) Int. Cl.
| | |
|---|---|
| *H03F 1/26* | (2006.01) |
| *H04B 15/00* | (2006.01) |
| *H03M 1/08* | (2006.01) |
| *G06K 9/62* | (2006.01) |
| *H03H 21/00* | (2006.01) |

(52) U.S. Cl.
CPC ............ *H03M 1/089* (2013.01); *G06K 9/624* (2013.01); *H03H 21/0012* (2013.01)

(58) Field of Classification Search
None
See application file for complete search history.

(56) References Cited

U.S. PATENT DOCUMENTS

| | | | | |
|---|---|---|---|---|
| 4,365,503 | A * | 12/1982 | Ho | G01F 25/0015 73/1.22 |
| 5,764,541 | A * | 6/1998 | Hermann | G01G 5/06 341/167 |
| 6,032,109 | A * | 2/2000 | Ritmiller, III | G01D 3/022 702/104 |
| 6,202,033 | B1 * | 3/2001 | Lange | H03H 21/003 702/104 |
| 6,355,916 | B1 * | 3/2002 | Siefert | G01K 7/42 219/494 |
| 6,889,175 | B2 * | 5/2005 | Green | G01S 5/0294 375/295 |
| 7,756,229 | B2 * | 7/2010 | Douglas | H03M 1/0629 375/350 |
| 8,209,083 | B2 | 6/2012 | Ganguli et al. | |
| 8,761,603 | B1 * | 6/2014 | Maleki | G01S 7/003 398/129 |
| 8,958,509 | B1 * | 2/2015 | Wiegand | H04B 1/1027 375/219 |
| 2002/0108006 | A1 * | 8/2002 | Snyder | G06F 1/08 710/100 |
| 2003/0063219 | A1 * | 4/2003 | Bellers | H03M 1/127 348/572 |
| 2003/0107509 | A1 * | 6/2003 | Drossel | G01L 19/12 341/155 |
| 2004/0138859 | A1 * | 7/2004 | Green | G01S 5/0294 702/190 |

(Continued)

*Primary Examiner* — Mohamed Charioui
*Assistant Examiner* — Leonard S Liang
(74) *Attorney, Agent, or Firm* — James J. McGroary

(57) ABSTRACT

A reconfigurable sensor monitoring system includes software tunable filters, each of which is programmable to condition one type of analog signal. A processor coupled to the software tunable filters receives each type of analog signal so-conditioned.

12 Claims, 3 Drawing Sheets

(56) References Cited

U.S. PATENT DOCUMENTS

| | | | |
|---|---|---|---|
| 2008/0150626 A1* | 6/2008 | DeAgro | H03H 7/0153 327/553 |
| 2008/0177436 A1 | 7/2008 | Fortson | |
| 2009/0326859 A1* | 12/2009 | Hammerschmidt | G01D 5/2448 702/151 |
| 2010/0057957 A1* | 3/2010 | Smilg | G05B 19/042 710/104 |
| 2014/0030987 A1* | 1/2014 | Man | H04B 1/3838 455/77 |
| 2014/0040706 A1* | 2/2014 | Wu | H04L 1/0041 714/776 |
| 2014/0287794 A1* | 9/2014 | Akhi | H04B 1/525 455/550.1 |
| 2015/0378954 A1* | 12/2015 | Field | G06F 13/4221 710/69 |

\* cited by examiner

RECONFIGURABLE SENSOR MONITORING SYSTEM

ORIGIN OF THE INVENTION

The invention described herein was made in the performance of work under a NASA contract and by an employee of the United States Government and is subject to the provisions of Section 20135(b) of the National Aeronautics and Space Act, Public Law 111-314, §3 (124 Stat. 3330, 51 U.S.C. Chapter 201), and may be manufactured and used by or for the Government for governmental purposes without the payment of any royalties thereon or therefore.

BACKGROUND OF THE INVENTION

1. Field of the Invention

This invention relates to sensor systems. More specifically, the invention is reconfigurable sensor monitoring system that is readily configured to filter sensor signals from a variety of sensor components prior to sensor signal sampling.

2. Description of the Related Art

Spacecraft avionics typically utilize a sensor avionics box that contains all the sensors and digital interfaces necessary for a complete spacecraft. This sensor subsystem usually has numerous sensors on one card and thus requires dense connectors with multiple contacts. If the mission is complex, a sensor box can have several sensor cards with different configurations for each card. Each external sensor from all over the spacecraft is wired to these sensor box connectors. Recently, some avionics designers have started to miniaturize the sensor electronics.

A major disadvantage of the prior art is that the resulting sensor avionics box is a spacecraft-specific, highly-integrated complex unit that requires a set of support equipment that is usually larger than the avionics box itself. Designers must understand all of the avionics, sensors, and specific applications before they can finish the electronics design. The electronics design is typically matured through the process of preliminary and critical design review cycles that require an extensive amount of time and effort. It is usually incumbent upon the design engineers to write test procedures that verify the functionality of the electronics box. Developing and implementing the testing can be time consuming and very complex. Special test equipment for a sensor electronics box of this type can be as complicated as the avionics box itself. Additionally, the special test equipment requires a significant developing and manufacturing investment. The overall cost associated with a typical sensor avionics box can be well into the millions of dollars for a specific mission. Unfortunately, since each mission's sensor avionics box is specially designed, this costly process gets repeated for every new spacecraft system at the expense of developer time, manpower and money.

SUMMARY OF THE INVENTION

Accordingly, it is an object of the present invention to provide a sensor monitoring system for use in spacecraft avionics.

Another object of the present invention is to provide a reconfigurable sensor monitoring system adaptable for use with a variety of spacecraft systems.

Other objects and advantages of the present invention will become more obvious hereinafter in the specification and drawings.

In accordance with the present invention, a reconfigurable sensor monitoring system includes a plurality of software tunable filters. Each software tunable filter is programmable to condition one type of analog signal such that a corresponding number of types of analog signals are adapted to be conditioned. A processor coupled to the software tunable filters receives each type of analog signal so-conditioned.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

Figure 1:
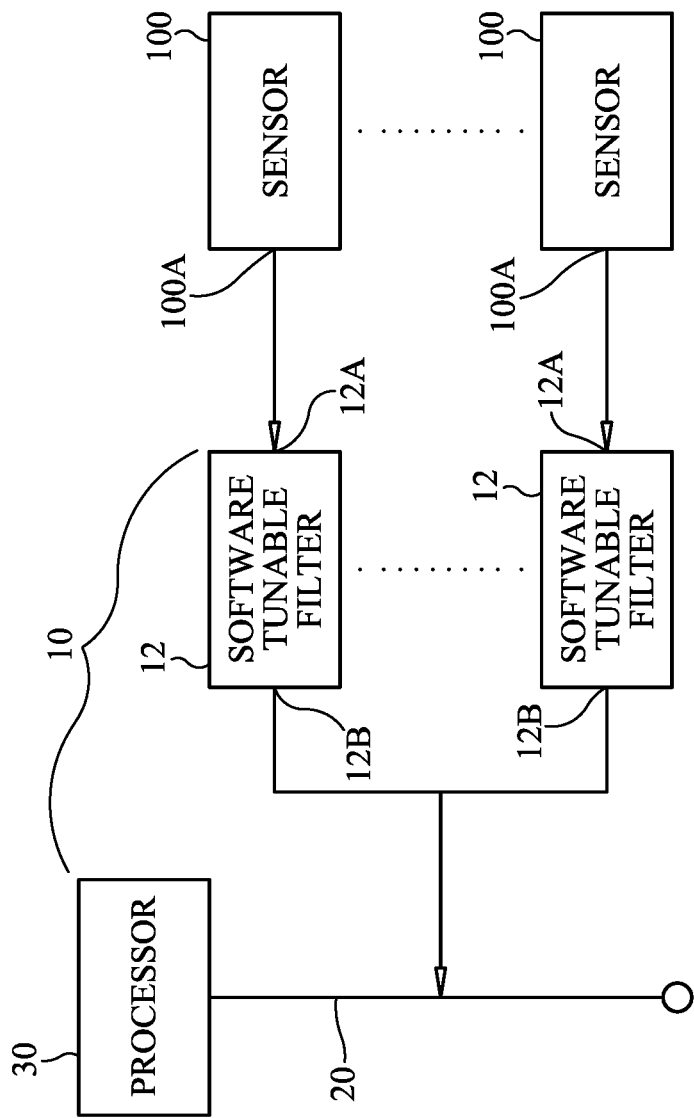
FIG. 1 is a block diagram of a reconfigurable sensor monitoring system in accordance with an embodiment of the present invention.

Referring now to the drawings and more particularly to FIG. 1, a block diagram of a reconfigurable sensor monitoring system in accordance with an embodiment of the present invention is shown and is referenced generally by numeral 10. As will be explained further below, sensor monitoring system 10 can be configured in a variety of ways to process or condition signals generated by a variety of types of sensors 100 providing sensor outputs to system 10. By way of example, such sensors include potentiometers, flow sensors, pressure sensors, thermistors, tachometers, as well as a variety of other types of sensors typically used in avionics designs. Accordingly, system 10 is well suited for incorporation into a variety of spacecraft avionic designs.

System 10 includes a plurality of software tunable filters 12 (e.g., two or more with the actual number not being a limitation of the present invention), each of which has an input 12A and an output 12B. Each input 12A has a particular sensor output 100A coupled thereto. Briefly, each sensor output 100A is conditioned in a pre-programmed fashion by its respective filter 12 to provide a digitized output at the filter's output 12B. The digitized output is placed on a data bus 20. A programmable controller/processor 30 is coupled to data bus 20 for receiving all digitized output signals at outputs 12B. Programmable processor 30 is programmed to control the operation of system 10 based on a particular configuration thereof and the type(s) of sensors 100 coupled to software tunable filters 12.

Figure 2:
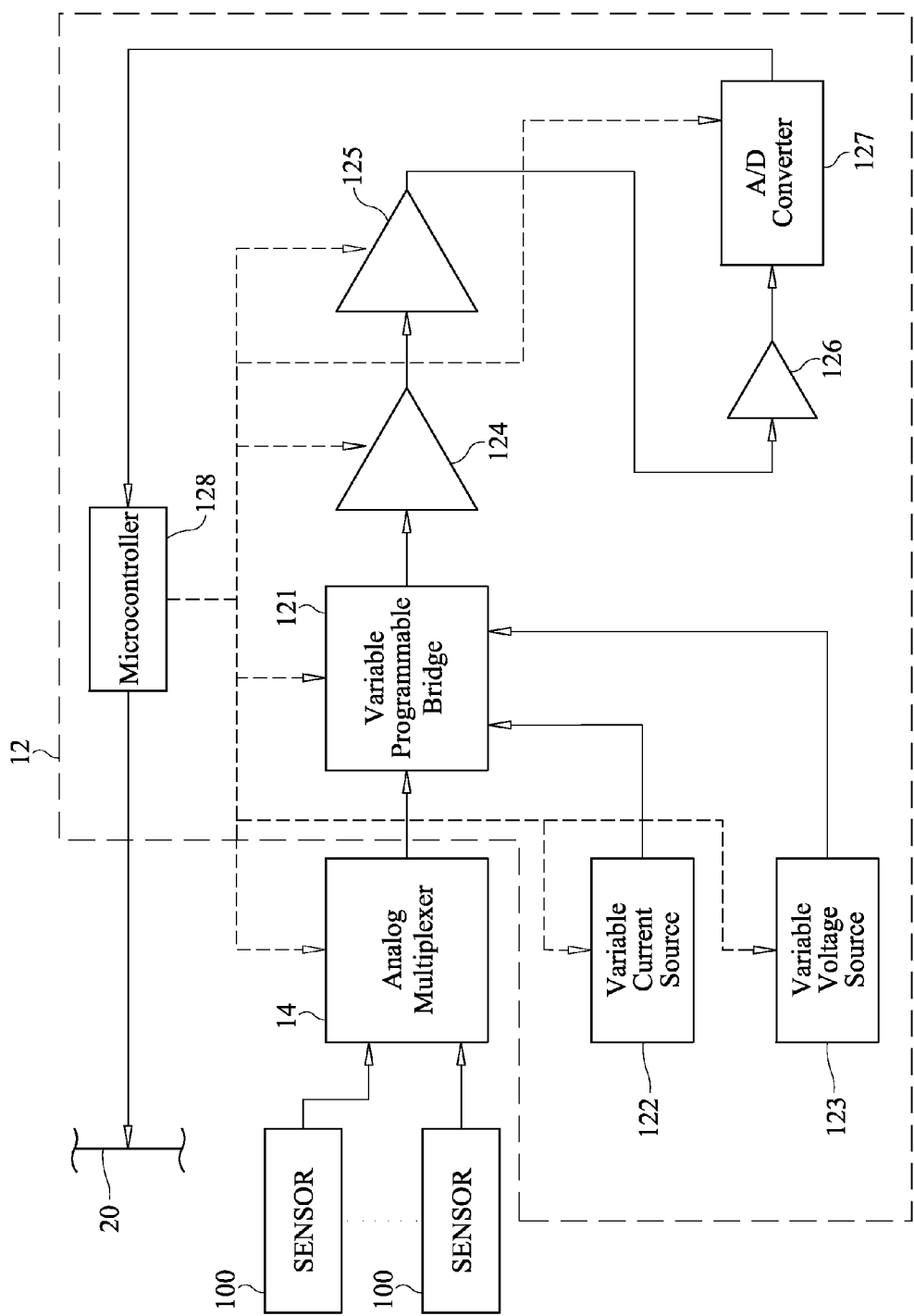
FIG. 2 is a schematic diagram of a software tunable filter in accordance with an embodiment of the present invention.

Referring additionally now to FIG. 2, a single one of software tunable filters 12 is shown. In FIG. 2, dashed lines represent control signals used for programming of the filter, and solid lines represent the signals being passed through and conditioned by filter 12. In an embodiment of the present invention, multiples of filter 12 can be connected to an analog multiplexer 14 programmed to accept or pass a particular type of analog signal that is generated by a particular type/one of sensors 100. The passed analog signal is provided to a variable programmable bridge 121 (i.e., settable resistors and switches) that accepts the inputs in a bridge configuration. A microcontroller 128 changes the configuration of bridge 121 to balance the bridge's input impedance with the rest of the bridge. A programmable and variable current source 122 and a programmable and variable voltage source 123 are coupled to bridge 121 so that they can be used if required by the particular sensor signal being conditioned by filter 12. The analog signal output from bridge 121 is next provided to a series of amplifiers and filters that provide specific amplification and filtering needed for the particular type of analog signal. The particular ordering of these elements is generally not critical. A programmable instrumentation amplifier 124 provides precision amplification to the signal without adding extra noise. A programmable filter/gain stage 125 provides the desired filter type (e.g., low pass, high pass, band pass, multiple pole, etc.) in order to remove undesired elements in the sensor signal or satisfy sampling frequency requirements. Finally, a programmable level adjust amplifier 126 adjusts the analog signal supplied thereto to the proper level prior to digitization by an analog-to-digital (A/D) converter 127.

The programming of the above-described elements of filter 12 is provided by a microcontroller (or field programmable gate array) 128 whose programming control signals are indicated by dashed lines. Each conditioned and digitized signal from A/D converter 127 is placed on data bus 20 by microcontroller 128, and then the next analog signal sampled from sensor 100 is processed.

Figure 3:
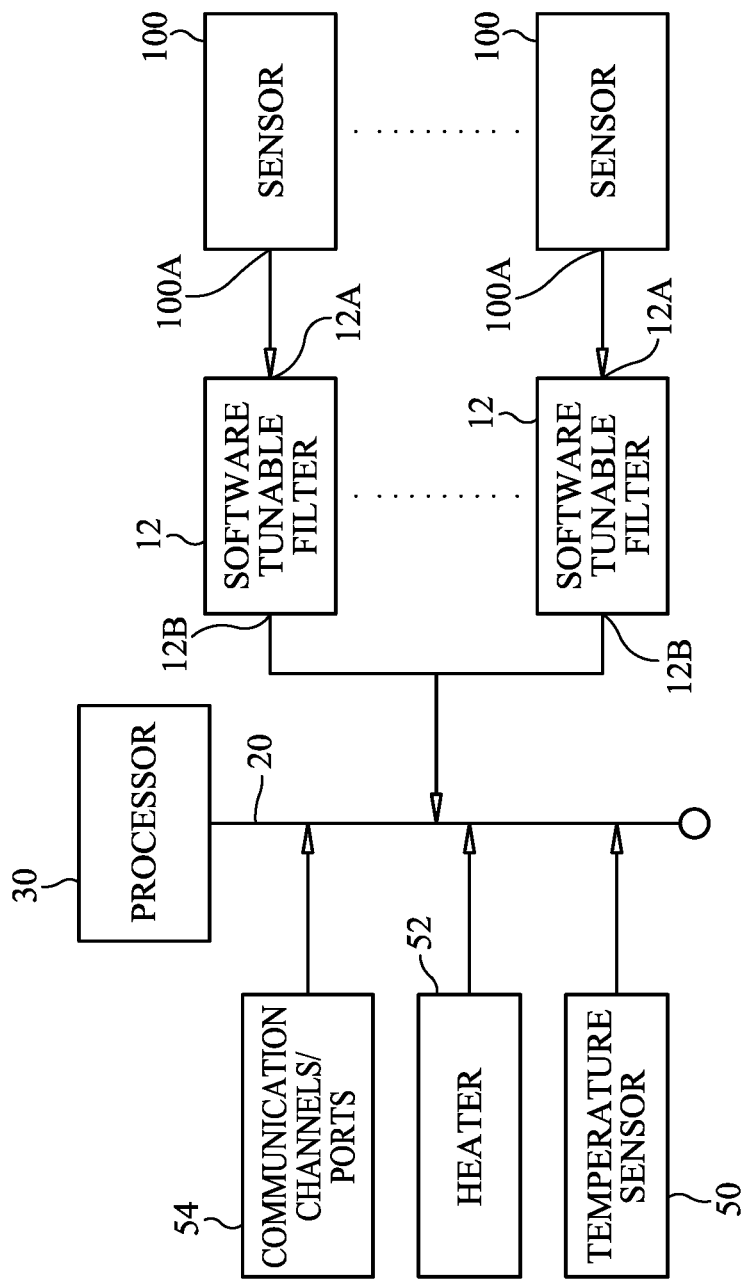
FIG. 3 is a block diagram of a reconfigurable sensor monitoring system in accordance with another embodiment of the present invention.

The reconfigurable sensor monitoring system of the present invention can include additional capabilities as illustrated in FIG. 3. For example, a temperature sensor 50 can be provided to monitor the temperature of the system. A heater 52 can be provided to generate heat for the components of the system when the system will be exposed to extremely cold environments (e.g., space). Sensor 50 and heater 52 can be coupled to one another (e.g., directly or indirectly through data bus 20) such that heater 52 is activated/deactivated predicated on the output of sensor 50. Processor 30 could be used to activate/deactivate heater 52 predicated on signals received from sensor 50. Programming for processor 30 could be provided off-line or in an on-line fashion. For on-line programming, one or more communication channels/ports 54 can be coupled to data bus 20. Communication channel 54 is representative of hardwired connections and/or wireless connections, either or both of which can be used without departing from the scope of the present invention.

The advantages of the present invention are numerous. The reconfigurable sensor monitoring system will eliminate the need to design spacecraft-specific sensor signal conditioning electronics. One or more of the sensor monitoring systems could be configured to support a wide variety of spacecraft systems. Configuration for a variety of spacecraft systems can be achieved by simply changing programming configurations of the software tunable filters' microcontrollers.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A reconfigurable sensor monitoring system, comprising:
    an analog multiplexer adapted to receive a plurality of types of analog signals;
    a plurality of software tunable filters, each of said software tunable filters coupled to said analog multiplexer, each of said software tunable filters being programmable to condition one type of analog signal from said plurality of types of analog signals, each of said software tunable filters including
    a variable current source,
    a variable voltage source,
    a reconfigurable bridge having an input coupled to said analog multiplexer and having an output, said reconfigurable bridge coupled to said variable current source and said variable voltage source, and
    a controller coupled to said reconfigurable bridge, said variable current source, and said variable voltage source, said controller providing control signals to said reconfigurable bridge, said variable current source, and said variable voltage source for impedance balancing said reconfigurable bridge for said one type of analog signal; and
    a processor coupled to said plurality of software tunable filters for receiving each said one type of analog signal so-conditioned.

2. A reconfigurable sensor monitoring system as in claim 1, wherein each of said software tunable filters further comprises:
    a series of amplifiers and filters coupled to said output of said reconfigurable bridge for amplifying and filtering said one type of analog signal; and
    an analog-to-digital converter coupled to said series of amplifiers and filters for digitizing said one type of analog signal amplified and filtered by said series of amplifiers and filters.

3. A reconfigurable sensor monitoring system as in claim 1, further comprising a temperature sensor coupled to said processor.

4. A reconfigurable sensor monitoring system as in claim 1, further comprising a heater coupled to said processor.

5. A reconfigurable sensor monitoring system as in claim 1, further comprising:
    a temperature sensor for sensing ambient temperature; and
    a heater coupled to said temperature sensor wherein operation of said heater is based on said ambient temperature.

6. A reconfigurable sensor monitoring system as in claim 1, further comprising at least one communications channel coupled to said processor.

7. A reconfigurable sensor monitoring system, comprising:
    an analog multiplexer adapted to receive a plurality of types of analog signals;
    a data bus;
    a plurality of software tunable filters, each of said software filters having an input coupled to said analog multiplexer and an output coupled to said data bus, each of said software tunable filters being programmable to condition one type of analog signal from said plurality of types of analog signals, each of said software tunable filters including
    a variable current source,
    a variable voltage source,
    a reconfigurable bridge having an input coupled to said analog multiplexer and having an output, said reconfigurable bridge coupled to said variable current source and said variable voltage source, and
    a controller coupled to said reconfigurable bridge, said variable current source, and said variable voltage source, said controller providing control signals to said reconfigurable bridge, said variable current source, and said variable voltage source for impedance balancing said reconfigurable bridge for said one type of analog signal; and a processor coupled to said data bus for receiving each said one type of analog signal so-conditioned.

8. A reconfigurable sensor monitoring system as in claim 7, wherein each of said software tunable filters further comprises:

a series of amplifiers and filters coupled to said output of said reconfigurable bridge for amplifying and filtering said one type of analog signal; and an analog-to-digital converter coupled to said series of amplifiers and filters for digitizing said one type of analog signal amplified and filtered by said series of amplifiers and filters.

9. A reconfigurable sensor monitoring system as in claim 7, further comprising a temperature sensor coupled to said data bus.

10. A reconfigurable sensor monitoring system as in claim 7, further comprising a heater coupled to said data bus.

11. A reconfigurable sensor monitoring system as in claim 7, further comprising:

a temperature sensor coupled to said data bus for generating an ambient temperature measurement wherein said ambient temperature measurement is available on said data bus; and a heater coupled to said data bus wherein operation of said heater is based on said ambient temperature measurement.

12. A reconfigurable sensor monitoring system as in claim 7, further comprising at least one communications channel coupled to said data bus.

\* \* \* \* \*